(12) United States Patent
Ito

(10) Patent No.: US 8,391,050 B2
(45) Date of Patent: Mar. 5, 2013

(54) RESISTANCE CHANGE ELEMENT, SEMICONDUCTOR MEMORY DEVICE, MANUFACTURING METHOD AND DRIVING METHOD THEREOF

(75) Inventor: Kimihiko Ito, Tokyo (JP)

(73) Assignee: NEC Corporation, Tokyo (JP)

( * ) Notice: Subject to any disclaimer, the term of this patent is extended or adjusted under 35 U.S.C. 154(b) by 230 days.

(21) Appl. No.: 12/919,459

(22) PCT Filed: Mar. 18, 2009

(86) PCT No.: PCT/JP2009/055265
§ 371 (c)(1),
(2), (4) Date: Aug. 25, 2010

(87) PCT Pub. No.: WO2009/116564
PCT Pub. Date: Sep. 24, 2009

(65) Prior Publication Data
US 2011/0007555 A1    Jan. 13, 2011

(30) Foreign Application Priority Data
Mar. 19, 2008    (JP) .................................. 2008-070795

(51) Int. Cl.
*G11C 11/00*    (2006.01)
*H01L 21/02*    (2006.01)
*H01L 45/00*    (2006.01)

(52) U.S. Cl. ............ 365/148; 438/382; 257/2; 257/536; 257/537

(58) Field of Classification Search .................. 365/148; 438/382; 257/2, 537, 536, 379
See application file for complete search history.

(56) References Cited

U.S. PATENT DOCUMENTS
2006/0081962 A1 *    4/2006    Wei et al. ...................... 257/537

FOREIGN PATENT DOCUMENTS
| JP | 9-129839 A | 5/1997 |
|---|---|---|
| JP | 2006120702 | 5/2006 |
| JP | 2006319342 A | 11/2006 |
| JP | 2007059914 A | 3/2007 |

OTHER PUBLICATIONS

International Search Report for PCT/JP2009/055265 mailed Jun. 23, 2009.
J. F. Gibbons et al., "Switching Properties of Thin NiO Films", Solid-State Electronics. Pergamon Press, vol. 7, 1964, pp. 785-797.

* cited by examiner

Primary Examiner — VanThu Nguyen
Assistant Examiner — Hai Pham

(57) ABSTRACT

To provide a resistance change element which can reduce the current required to switch the state to the high resistance state from the low resistance state. The resistance change element according to the exemplary embodiment includes three or more electrodes, none of the electrodes supplying ion to a resistance change material (205). It includes a material (206) which does not show resistance change arranged between an electrode (207) and the resistance change material (205), and current pathways formed at two electrodes (204) other than the electrode (207).

6 Claims, 20 Drawing Sheets

RESISTANCE CHANGE ELEMENT, SEMICONDUCTOR MEMORY DEVICE, MANUFACTURING METHOD AND DRIVING METHOD THEREOF

TECHNICAL FIELD

The present invention relates to a resistance change element, a semiconductor memory device, a manufacturing method and a driving method thereof.

BACKGROUND ART

Nonvolatile memories that are widely used in a market include flash memories or memories having a SONOS (Silicon Oxide Nitride Oxide Silicon) laminated structure. These memories are manufactured by using a technique to change the threshold voltage of a semiconductor transistor by the charge stored in an insulating film arranged above a channel region of the semiconductor transistor.

Microfabrication is essential to increase capacitance of a semiconductor transistor. Nowadays, however, it is difficult to even microfabricate a single semiconductor transistor having no charge accumulative function. Consequently, the semiconductor transistor only has a switching function to select memory cells read and written. A memory element is divided from the semiconductor transistor like a DRAM (Dynamic Random Access Memory). It is promoted to continue increasing capacitance of the semiconductor transistor by promoting microfabrication of each of these elements.

In order to continuously microfabricate an information memory function, it is studied to use a resistance change element as a memory element that uses an electrical element which can turn electrical resistance into signals having two or more values by some electrical stimulus. In a method of storing charge in a capacitance like DRAM, quantity of charge is decreased by microfabrication and degradation of the signal voltage is unavoidable. However, as electronic resistance takes the finite value even with microfabrication unless it is in the superconductive state, it is considered that there is an advantage to continue microfabrication if there is a principle and a material which change resistance value.

There exist several techniques to change electrical resistance by some electrical stimulus. One of the techniques that is advanced the most is a memory device to take advantage of switching crystal layers (amorphous crystals) that have different electrical resistances by double or triple figures by applying the current to a chalcogenide semiconductor. This memory device is typically called phase-change memory.

On the other hand, Metal/Metal oxide/Metal (hereinafter called MIM type) structure which has metal oxide sandwiched between electrodes is known to cause a resistance change upon application of high voltage or current. The present invention mainly relates to a MIM type resistance change element.

FIG. 1 is a schematic diagram showing the MIM type resistance change element. In FIG. 1, numeral 1 indicates an upper first electrode of the MIM type resistance change element. Numeral 2 indicates a resistance change material made of metal oxide. Numeral 3 indicates a lower second electrode of the MIM type resistance change element.

Non-Patent Document 1 discloses the resistance change element using Nickel Oxide (NiO). In 1950-1960, a phenomenon that resistance values are changed by voltage or current in a variety of materials were researched and reported.

FIG. 2 shows current-voltage characteristics of the MIM type resistance change element shown in FIG. 1. The resistance change element maintains a high-resistive OFF state or a low-resistive ON state in a nonvolatile manner even after it has been turned off and can switch resistance states by applying prescribed voltage or current stimulation when it is necessary. FIG. 2 shows an example of current-voltage characteristics of ON state and OFF state.

Applying a voltage of Vt1 or more to the high-resistive OFF state element, it is turned into the low-resistive ON state and shows current-voltage characteristic shown in FIG. 2($b$). Then, applying a voltage of Vt2 or more to ON state element shown in FIG. 2($b$), it is turned into the high-resistive OFF state and shows current-voltage characteristic shown in FIG. 2($a$) again. The MIM type resistance change element can switch the state shown in FIG. 2($a$) and that shown in FIG. 2($b$) repeatedly. This characteristic can be used as a nonvolatile memory cell or a nonvolatile switch for switching circuits. In addition, the reference value that is criterion for high resistance or low resistance is not limited. Every reference value can be used if it is possible to switch high resistance and low resistance relatively. Note that 10 k$\Omega$ is favorably used as a reference value for example.

Additionally, in the MIM type resistance change element including metal oxide, a current pathway which is used in the low resistance state is not formed in the whole electrode surface, but is a regional current pathway 4 which is approximately several nm, or not more than several tens of nm in diameter as schematically shown in FIG. 3.

FIG. 4 shows electrode area dependencies of the resistance value in the low resistance state in the MIM type resistance change element of parallel plate type. Note that dependent properties shown in FIG. 4 are those in the case that NiO is used as the resistance change material of the current pathway 4 like Non-Patent Document 1. As shown in FIG. 4, the resistance value in the low resistance state is hardly depend on electrode area, and the low resistance state is kept by the current pathway 4 formed regionally. Therefore, in the case of applying the MIM type resistance change element as a memory element, the electrical resistance in the high resistance state is higher with the microfabrication and the electrical resistance in the low resistance state is almost unchanged. The resistance ratio between the states can be made higher. Consequently, it may be said that the MIM type resistance change element is a memory element suitable for microfabrication.

As shown in FIG. 5, however, there is a problem that the lower the resistance value in the low resistance state is, the more current a two-terminal MIM type resistance change element needs when switching to the high resistance state. Thus, when a fuse/anti-fuse type switching element which can repeatedly switch resistance states is realized, the problem described above is a major issue.

The two-terminal MIM type resistance change element needs a high-capacity power supply circuit (a driver) when switching the state to the high resistance state from the low resistance state. The point of power consumption and the point of increased manufacturing cost owing to increased chip area are also major issues.

A resistance change element having three or more terminals is also a semiconductor transistor. For example, a MOS transistor having a gate terminal of Metal Oxide Semiconductor (MOS) type can adjust the conductance between a source and a drain by controlling carrier density induced at depleted layer width of a semiconductor under the gate, that is, the interface between an insulator and the semiconductor by applying a voltage to the gate terminal. The amount of carriers induced in this case is approximately $10^{18}(cm^{-3})\sim10^{20}(cm^{-3})$ in volume density.

A three-terminal type element having a semiconductor material in place of metal oxide is disclosed in Patent Document 1 and 2, for example. In Patent Document 1 and 2, an element which has a structure like a MOS type semiconductor transistor having metal oxide in place of semiconductor part is disclosed. They have multiterminal arrangement like semiconductor transistor having a source, a drain and a gate.

The resistance change element is the same as the semiconductor transistor on the point that charge is induced at the interface between the metal oxide and the insulator by the electric field generated in the gate terminal. However, the resistance change element is widely different from the semiconductor transistor in that the operating principle of the resistance change element is to change the conductance of whole surface under the gate electrode by producing the metal-insulator transition of the oxide material by the induced charge. The resistance change element needs to change the amount of charge of $10^{21} \sim 10^{22} (cm^{-3})$ or more in volume density to produce the metal-insulator transition. This charge density is 100 times as much as that which is necessary to drive the MOS type semiconductor transistor.

Consequently, the resistance change element needs to generate an extremely high electric field just below the gate. A material for the insulator under the gate needs to have not only low interface state density but extremely high insulation breakdown voltage. This is a major obstacle to realize it.

In the present invention, the filamentary current pathway 4 with an extremely small cross-sectional area is formed between the electrodes corresponding to the source and the drain. The present invention is widely different from Patent Document 1 and 2 in that the current pathway 4 is maintained even after the power off in a nonvolatile manner. The current pathway 4 is formed by the structural change of microscopic area by minimal migration of metal or oxygen in a crystal, which is not so called metal-insulator transition by the control of the amount of charge in the material, as described below.

Another additional electrode controls or assists forming or breaking of the tiny current pathway 4. The high electric field to induce the metal-insulator transition is not needed. Additionally, in Patent Document 1, a tunnel insulator is provided between the source/drain electrode and the metal-insulator transition material in the MOS type transistor. In the present invention, the tunnel insulator is not needed. This point is also widely different.

Further, there exists a prior art document filed before the present invention which discloses a nonvolatile semiconductor memory device having an ion-conducting layer (see for example Patent Document 3).

Patent Document 3 discloses the nonvolatile memory device including a substrate, a switching element formed on the substrate, and a storage node connected to the switching element, in which the storage node has a lower electrode connected to the switching element and used as ion source, a data store layer formed over the lower electrode, a part of the data store layer being isolated from the lower electrode, a lateral electrode having a side face connected to the part of the data store layer isolated from the lower electrode, the lateral electrode being isolated from the lower electrode, and an upper electrode formed on the data store layer.

[Patent Document 1]
Japanese Unexamined Patent Application Publication No. 2006-319342
[Patent Document 2]
Japanese Unexamined Patent Application Publication No. 9-129839
[Patent Document 3]
Japanese Unexamined Patent Application Publication No. 2007-59914
[Non-Patent Document 1]
J. F. GIBBONS and W. E. BEADLE 'SWITCHING PROPERTIES OF THIN NiO FILMS' Solid-State Electronics, Vol. 7, P. 785-797, 1964.

DISCLOSURE OF INVENTION

Technical Problems

Patent Document 3 discloses the nonvolatile semiconductor memory device having an ion conducting layer. However, Patent Document 3 does not disclose or suggest the demand of the resistance change element having three or more electrodes, none of the electrodes supplying ion to the resistance change material.

The present invention has been made in view of the above circumstances. One object of the present invention is to provide a resistance change element, a semiconductor memory device, a manufacturing method and a driving method thereof that can solve above problem, in other words, that can reduce the current required to switch the state to the high resistance state from the low resistance state.

Technical Solution

To attain the object, the present invention has the feature described below.
<Resistance Change Element>
According to the present invention, there is provided a resistance change element having three or more electrodes, none of the electrodes supplying ion to a resistance change material including a material which does not show resistance change arranged between one electrode and the resistance change material, current pathways formed at two electrodes other than the electrode.
<Semiconductor Memory Device>
According to the present invention, there is provided a semiconductor memory device including the resistance change element described above.
<Manufacturing Method>
According to the present invention, there is provided a manufacturing method of a resistance change element having three or more electrodes, none of the electrodes supplying ion to a resistance change material, and the method includes arranging a material which does not show resistance change between one electrode and the resistance change material and forming current pathways at two electrodes other then the electrode.
<Driving Method>
According to the present invention, there is provided a driving method of a resistance change element having three or more electrodes, none of the electrodes supplying ion to a resistance change material, the resistance change material including a material which does not show resistance change arranged between one electrode and the resistance change material, and the method includes forming current pathways at two electrodes other then the electrode.

Advantageous Effects

According to the present invention, it is possible to reduce the current required to switch the state to the high resistance state from the low resistance state.

BEST MODES FOR CARRYING OUT THE INVENTION

<Outline of Resistance Change Element According to the Exemplary Embodiment>

Outline of a resistance change element according to the exemplary embodiment is described with reference to FIGS. 23 and 3.

As shown in FIG. 23, the resistance change element according to the exemplary embodiment has three or more electrodes (204, 207, 202) in which every electrode does not supply ion to a resistance change material (205). This is characterized by having a material (206) which does not show the resistance change arranged between the electrode (207) and the resistance change material (205), and a current pathway (4) shown in FIG. 3 formed at the two electrodes (204) other than the electrode (207). According to this, it is possible to reduce the current required to switch the state to the high resistance state from the low resistance state. The resistance change element according to the exemplary embodiment will be now described herein with reference to attached drawings.

At first, a conduction mechanism of the high resistance state and the low resistance state in a two-terminal type element will be described briefly.

In the conduction mechanism of the high resistance state and the low resistance state, it is important that metal or oxygen defect is included in a metal oxide layer in the order of percent density. In the exemplary embodiment, NiO is described as an example. NiO ideally forms a crystalline of rock salt structure with a ratio of Ni to O of 1 to 1. Actually, Ni defect tends to occur. FIG. 6 schematically shows a state in which the surrounding area of Ni defect occurred in NiO crystalline is divided along (001) plane.

Ni defect performs as divalent negative charge (acceptor) effectively. Note that in the material such as FeO or the like, it is considered that redundant charge is induced in metal ion as shown in FIG. 6 to compensate imbalance of ions produced by injection of defects.

On the other hand, the material such as NiO, CoO, MnO or the like is classified into a charge-transfer type insulator. FIG. 7 shows a conceptualistic band structure thereof. The band gap is considered to exhibit the feature of the 2p orbital of oxygen while the band gap is determined by the energy required to transfer the charge to the d orbital of the transition metal which is upper than the 2p orbital of oxygen and the electron orbital near the top of the valence band is hybridized with the d orbital of the transition metal.

Thus, it is considered that the hole produced by charge compensation of the metal defect enter the 2p orbital of oxygen which is six-coordinate around the metal defect as shown in FIG. 8. The induced hole is known to have a tendency to localize around the metal defect with lattice distortion. This state can be depicted schematically as "the metal defect that puts on a hole gown" as shown in FIG. 9.

NiO sandwiched between an upper electrode and a lower electrode made of platinum group metal electrode is considered to be in the state in which "Ni defect that puts on a hole gown" is randomly-dispersed in the order of percent density in NiO as shown in FIG. 10. Note, in FIG. 10, numerals 301 and 303 indicate electrodes. Numeral 302 indicates transition metal oxide. Numeral 304 indicates electron.

In the state shown in FIG. 10, electric conduction at around room temperature is restricted to the mechanisms that are "1": mechanism surmounting potential barrier at the electrode interface and "2": mechanism in which the hole hops between Ni defects as shown in FIG. 11.

In low temperature, conduction with "3": tunneling between defects with little thermal excitation is considered to be dominant other than thermal activity type "1" or "2". When NiO is considered to be a semiconductor, conduction images corresponding to "1"-"3" of FIG. 11 are shown in FIG. 12.

After the transition to the low resistance state, temperature dependencies of electric resistance become extremely small as shown in FIG. 13. It can be explained by thinking that the mechanism "3" of FIGS. 11 and 12 is emphasized, and Ni defects are arranged in one-dimensional chain as shown in FIG. 14. It is the key to control the resistance change phenomenon that Ni defects form one-dimensional chain. The formative mechanism will be described below.

Here, a resistance change element (Nano Bridge) running on another principle which is different from that used in the exemplary embodiment will be described as a target for comparison of resistance change element without ion source in electrode with reference to FIGS. 15 to 18. The resistance change element (Nano Bridge) is a two-terminal MIM type resistance change element and has ion source in the electrode. The resistance change element (Nano Bridge) is explained only for comparison of the exemplary embodiment.

Numeral 101 in FIG. 15 indicates an electrode. The electrode 101 is made of element in which ions such as Cu or Ag can transfer in a solid electrolyte 102. An element such as Pt or the like, which is hardly ionized, is usually used for a counter electrode 103. When a power source is connected as shown in FIG. 15, an electron 104 in the electrode 101 transfers to an electric wiring side and a metal element of the electrode 101 is ionized at the interface between the electrode 101 and the solid electrolyte 102. Thus, the positively-charged ion 105 begins to transfer to the counter electrode 103 side. Then, the ion 105 receives the electron 104 at the interface between the counter electrode 103 which is the negative electrode and the solid electrolyte 102 as shown in FIG. 16. The ion 105 is reduced by receiving the electron 104 to deposit a metal element 106 as shown in FIG. 17. The electric field is easily concentrated between the metal element 106 and the electrode 101 other than surrounding area. Additionally, the electron 104 transfers freely in the deposited metal. Thus, a reductive reaction of the ion 105 is preferentially performed at the end of the metal element 106 as shown in FIG. 18. Accordingly, the bridge formation of the metal element 106 grows so that the end of the metal element 106 is grown. When the end of the bridge formation of the metal element 106 reaches the electrode 101, the resistance change element transits to the low resistance state. In the process of the transfer of the ion 105 and metal deposition, an oxidation-reduction of the metal element 106 is absolutely imperative process. In addition, this state can be brought back to the high resistance state by reversing the battery and the direction of the electric field in the solid electrolyte 102.

Described next is, the operating principle when the element (for example platinum group elements such as Pt, Ru or the like) which is hard to transfer within the oxide material that shows resistance change even if it is ionized is used for all the electrodes, that is, the operating principle of the two-terminal MIM type resistance change element without ion source in the electrode. The initial resistance of the NiO element of virgin sample is in the high resistance state unless the film thickness is made thinner than or equal to 10 nm or the surface roughness is increased. To transit from the high resistance state to the low resistance state, the operation (the application of electric field) typically called "forming" in which the current pathway 4 with an extremely small cross-sectional area shown in FIG. 3 is initially formed is needed. The "forming" makes one-dimensional array structure of Ni defects as shown in FIG. 14. The microscopic behavior of the ions 105 previously-included in the resistance change material is important. As described above, it must be noted that the ion 105 is not supplied to the resistance change material from the electrode.

When the "forming" is performed, it is necessary that the current pathway 4 is preferentially formed. The current pathway 4 is distributed randomly in the virgin sample. The bigger the element area is, the higher the probability of including the nucleus is.

FIG. 19 shows the area in which Ni defects are located adjacent each other in FIG. 10 (point which is surrounded by a dotted line). The hole localized around the isolated Ni defect cannot transfer unless it is thermally-activated. When Ni defects are located adjacent each other to form a complex of defects, it is considered that holes easily transfer only inside of it. If Ni defects are connected from one electrode 301 as shown in FIG. 10, the holes easily transfer to the end of the nucleus contacted with the electrode 301 when the electric field is applied in this state and the electric field is applied intensively in the counter electrode 303 and the end of the nucleus. These areas perform as the product nucleus of the current pathway 4.

Here, it is assumed that the end of the product nucleus and one or more Ni ions are sandwiched between Ni defects. When the electric field is applied, the hole, which is a charge carrier, starts to transfer to the counter electrode 303 from adjacent Ni defect by the hopping mechanism. The transfer of the hole to the surrounding area of Ni defects is equal to the reduction (electron reduction) of the surrounding of defects. Since holes are continuously supplied from the positive electrode through the product nucleus and Ni defects, the oxidation-reduction is occurred repetitively at the surrounding area of the Ni defect which is discussed here.

The greater the electric field is, the less the increasing rate of the probability of the hopping (mobility) is because the transfer of the hole is performed by the hopping mechanism and the electric field dependencies of the conduction mechanism are proportional to the square root of the electric field intensity.

It should be noted that the electric field is also applied to Ni ions between the end of the product nucleus and the adjacent Ni defect. Since the transfer probability of the Ni ion is proportional to the electric field intensity, it is considered that the transfer probabilities of the hole and the Ni ion against the electric field are schematically plotted as shown in FIG. 20. Therefore, in the threshold electric field indicated by Eth in FIG. 20 or above, the Ni ion transfers to the adjacent Ni defect more easily than the hole does (hopping).

The time change of the electric field of the area indicated by "P" in FIG. 19 is schematically shown in FIG. 21. In FIG. 21, "1" indicates the case in which the hole is supplied to the adjacent defect from the filamentary conductive pathway which is grown (low electric field). Further, "2" indicates the case in which the Ni ion between filament and adjacent defect transfers to the adjacent defect (in the threshold electric field Ef or above). "A" and "A" indicate the moment that the hole escaped from the adjacent defect (reduced) (the surrounding area of the defect is effectively negatively-charged strongly). "B" indicates the moment that the hole performs hopping to the adjacent defect from the filament. "C" indicates the moment that the interlaid Ni ion transfers to the adjacent defect.

In the low electric field, hopping conduction between the defects is predominante. The holes are continuously supplied to the adjacent defects, so the electric field returns to its original state. However, in the high electric field, once the adjacent defects are reduced, the interlaid Ni ion transfers to the adjacent defect as indicated by "C" in FIG. 21.

This process in which the hole is taken away from original Ni defect (the electron is supplied) at first, then the Ni ion transfers corresponds to the reduction process of the metal ion at the counter electrode of the resistance change element with the ion source in the electrode as described above. That is, the resistance change element used in the exemplary embodiment has a commonality with the element having an ion source in the electrode. Since it is occurred at the position of lattice defect in the metal oxide, it requires a shorter transfer distance of the ion. This is the reason why the rate of resistance change of this type of resistance change element is higher by several orders of magnitude.

Note, the probability that the Ni ion at the position of lattice is come up to the interstitial region to form the interstitial defect is extremely low. This is because the filling rate of the ion is high since NiO has a rock salt type crystalline structure that is an embedded structure in which face-centered cubic structures of O and Ni are displaced one another by (½, 0, 0). Actually, the interstitial defect is not considered to occur in NiO. The preferential and ascendant destination of Ni ion at the position of lattice is only the position of the Ni defect.

The regional transfer process of the Ni ion described above is treated as occurrence of the new Ni defect at the end of the product nucleus focusing on the Ni defect. This indicates that the chain of the connected Ni defect is extended, that is, the filament that allows the hole to easily transfer by the orbital with wide bandwidth like oxygen 2p orbital, which is the current pathway 4, is grown toward the counter electrode.

Additionally, the electric field between the end of the filament and the counter electrode is higher than that before the transfer of the Ni ion. The end of the filament is considered to grow at an accelerated pace. As a matter of course, in this case, the existence of the Ni defect located adjacent to the end is an essential condition to grow. In the filament that does not satisfy this condition, growth is stopped in midstream. The filament that satisfies this condition selectively continues to grow, and is finally connected to the counter electrode. In this process, the pathway in which defects are connected forms a bridge between electrodes to transit to the low resistance state.

Generally, in the metal oxide, it is often the case that transfer of the metal defect is not really a problem because the mobility of the oxygen defect is high. However, in NiO, CoO, CuO or the like, the binding mode between the oxygen and metal is not pure ion binding, and has covalently elements. The energy produced by the reaction with oxygen per monoatom is about ten times as high as that of S or Se compound used in the phase-change memory. Therefore, if there are defects adjacent each other in the state with the high electric field applied as shown in FIG. 21, transfer of the ion sufficiently occurs.

The energy state of cross section of the element in this state is schematically illustrated by semiconducting band structure as shown in FIG. 14. Metal defects connected each other are equal to new conductive band formed in the initial NiO band. Thus, the energy barrier which exists at the interface of the electrode evaporates at the same time. The mobility of the hole, which is a carrier, and the density of the hole in the pathway become extremely high concurrently. Therefore, the electric conductivity represented by the product of them is enlarged by several orders (the electric resistance goes down).

Next, the transit mechanism to the high resistance state from the low resistance state which is important in the exemplary embodiment is described on the basis of the behavior of the current pathway 4 described above.

In the one-dimensional filament, the mobility of the hole is high, and the temperature dependencies of the resistance takes near value of that of the degenerated semiconductor or metal. Nevertheless, it has a finite electric resistance.

Consequently, if the current value greater than or equal to the certain constant value is applied in this state, Joule heat is produced in proportion to the square of the current value of the filament and their own resistance value as shown in FIG. 22. The low resistance state is stable in the state in which Ni defects are arranged in one-dimensional form. The lattice vibration becomes stronger with increasing temperature, and the probability that the thermally adjacent Ni ion transfers (diffuses) to the Ni defect on the filament becomes higher. As shown in FIG. 22, if only a part of Ni defect on the pathway is filled with Ni ions, the transfer of the hole on the pathway is limited by the hopping transfer at the shredded point and the resistance value becomes higher. This is the fracture of the pathway. It is certain that the fracture of the pathway frequently occurs in a neighborhood of the interface of the electrode.

The mechanism described above is treated as the behavior of the oxygen defect in the oxide which easily produces the oxygen defect such as TiOx or WOx or the like and shows the n-type conduction. Thus, it is considered that the arrangement of the one-dimensional oxygen defect is formed in the "forming", and the electron induced in the d orbital of surrounding Ti or W carries out the conduction.

In this exemplary embodiment, the low resistance filament is formed between the two electrodes by the mechanism described above. In the transit process to the high resistance state, a third electrode which can apply the electric field in the direction not parallel to the growth direction of the filament is provided above the resistance change material via an insulator. Therefore, it is possible to streamline the transit to the high resistance state and to reduce the required current by the combined effect of the increase of the mobility of the lattice defect by Joule heat produced in the filament and the electric field produced by the third electrode.

Additionally, FIG. 23 shows the basic structure of the resistance change element according to the exemplary embodiment. The resistance change element according to the exemplary embodiment has an insulator 203 on a fourth electrode 202, and a resistance change material 205 on the insulator 203. Further, it has first and second electrodes 204 and an insulator 206 on the resistance change material 205 and a third electrode 207 on the insulator 206. Furthermore, it has an interlayer insulating film 201 at both ends of the insulator 203, the resistance change material 205 and first and second electrodes 204. The resistance change element according to the exemplary embodiment can reduce the current required to switch the state to the high resistance state from the low resistance state by having the structure shown in FIG. 23.

(First Structure of Resistance Change Element)

Next, the first structure of the resistance change element according to the exemplary embodiment will be described with reference to FIGS. 24 to 27. Note, FIGS. 24 to 27 are views to show the manufacturing process of the first structure of the resistance change element according to the exemplary embodiment. FIG. 27 is a schematic completion drawing.

FIG. 24 is a sectional view showing the structure in which the fourth electrode 202 is formed to be as flat as possible between interlayer insulating films 201 on a wafer which is composed of Si substrate including a logic circuit, a power circuit and so on.

In contrast to FIG. 24, as shown in FIG. 25, the insulator 203 such as MgO (which has the same NaCl type structure and similar lattice constant as NiO) or Al2O3 is deposited. Then, after first and second electrodes 204 in which the current pathway 4 is formed therebetween are deposited, an opening is formed above the fourth electrode 202 by a method such as dry etching.

Next, as shown in FIG. 26, the resistance change material (NiO) 205 is deposited to several to 20 nm so as to fill the opening. Further, the gate insulator 206 of MgO etc. and the third electrode (platinum group such as Ru, TaN, TiN, or W) 207 are sequentially deposited. As shown in FIG. 27, the third electrode 207 is manufactured by the method such as dry etching. Note, pure metal oxide such as NiO as well as that with Al, Ti, or Ta in the range of 1-10% can be used for the resistance change material 205.

Next, after depositing the stopper insulator such as SiN and the interlayer insulating film sequentially, a contact hole is formed by dry etching. The surface of the portion of S/D is treated with excess oxidation using plasma oxidation etc., or the resistance of the portion of S/D is reduced by the implantation of Li ion. The contact hole is filled with the metal such as W or TiN.

(Second Structure of Resistance Change Element)

Next, the second structure of the resistance change element according to the exemplary embodiment will be described with reference to FIG. 28. Note, FIG. 28 is a view to show the manufacturing process of the first structure of the resistance change element according to the exemplary embodiment and is a schematic completion drawing. As shown in FIG. 28, the second structure has a resistance change material 205 embedded between two electrodes 204.

At first, in contrast to FIG. 24, as shown in FIG. 25, the insulator 203 such as MgO (which has the same NaCl type structure and similar lattice constant as NiO) or Al2O3 is deposited. Then, after first and second electrodes 204 in which the current pathway 4 is formed therebetween are deposited, an opening is formed above the fourth electrode 202 by a method such as dry etching. Next, the resistance change material (NiO) 205 is deposited to several to 20 nm so as to fill the opening. Further, the gate insulator 206 of MgO (which has the same NaCl type structure as NiO, and has almost the same lattice constant) or Al2O3 is deposited. Following this, the third electrode (platinum group such as Ru, TaN, TiN, or W) 207 is deposited. As shown in FIG. 28, the third electrode 207 is manufactured by the method such as dry etching.

(Driving Method of Resistance Change Element)

Next, the driving method of the resistance change element according to the exemplary embodiment will be described with reference to FIG. 29. A low resistance filament is formed between two electrodes arranged on the plane parallel to the substrate by the "forming" similar to that for the two-terminal type element. In the operation of cutting the filament, first, the surrounding area of the filament is heated by applying V1 to apply the current to the filament. The applied current i can be smaller than the current I required to cut the filament in the two-terminal type element (i<I). Then, after the certain period of time, most preferably, 10 to 100 nsec, V2 is applied to the third electrode or between the third and fourth electrodes to generate an electric field in which the direction of the electric field is not parallel to the filament. Accordingly, the lattice defect forming the filament is transferred and the filament is cut.

<Operation and Advantageous Effects of Resistance Change Element According to the Exemplary Embodiment>

As is obvious from the above description, the resistance change element according to the exemplary embodiment has a device structure having an additional electrode contacted with the resistance change material via a high insulating material other than two electrodes contacted with the resistance change material directly. Accordingly, it is possible to realize the mechanism in which the electric field can be applied at an angle not parallel to the current pathway using the third or fourth electrode without applying high current between two electrodes contacted with the resistance change material directly. Therefore, the current required to switch the state to the high resistance state from the low resistance state can be reduced.

While the exemplary embodiment described above is preferred embodiment. The scope of the claims is not limited by the exemplary embodiments described above. The invention can be practiced with various modifications without departing from the scope of the invention.

For example, it is only necessary that the resistance change element described above is included in the semiconductor memory device, and the structure of that is not specifically limited. It is also possible to apply semiconductor memory devices having different structures.

This application is the National Phase of PCT/JP2009/055265, filed Mar. 18, 2009, which is based upon and claims the benefit of priority from Japanese patent application No. 2008-070795, filed on Mar. 19, 2008, the disclosure of which is incorporated herein in its entirety by reference.

BRIEF DESCRIPTION OF DRAWINGS

FIG. 6 is a schematic view showing the metal defect in the metal oxide having a rock salt type crystalline structure such as FeO or the like;

FIG. 7 is a schematic view showing band structure or state density of a charge-transfer type insulator such as NiO or the like;

FIG. 8 is a schematic view showing metal defect in the charge-transfer type insulator such as NiO or the like;

EXPLANATION OF REFERENCE

Figure 1:
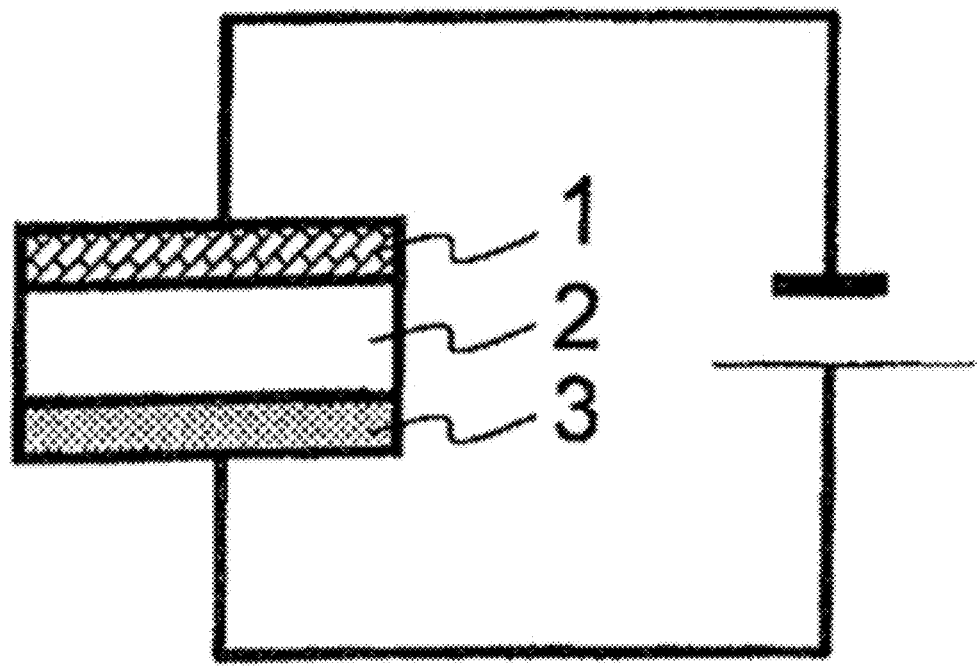
FIG. 1 is a basic schematic sectional view of a MIM type resistance change element.
Figure 2:
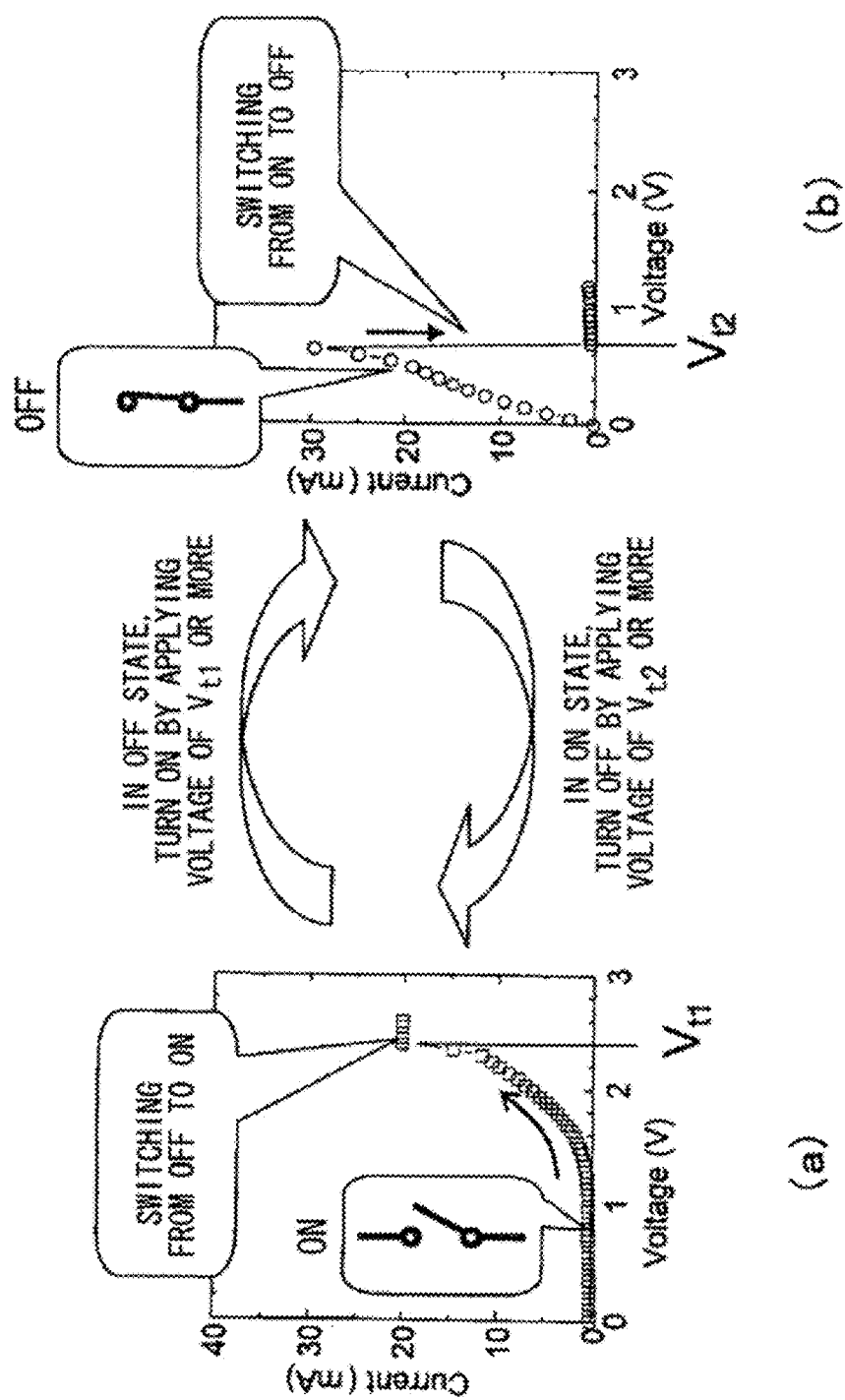
FIG. 2 is a view showing basic resistance change characteristics of the MIM type resistance change element including Ni oxide as resistance change material.
Figure 3:
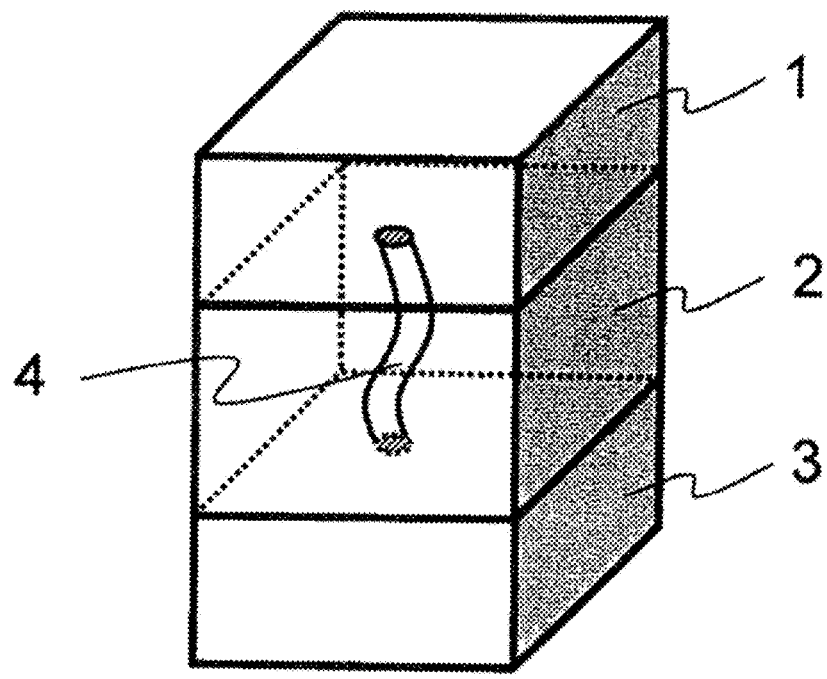
FIG. 3 is a schematic view of the regional current pathway 4 which is used in ON state in an overhead perspective view of the MIM type resistance change element.
Figure 4:
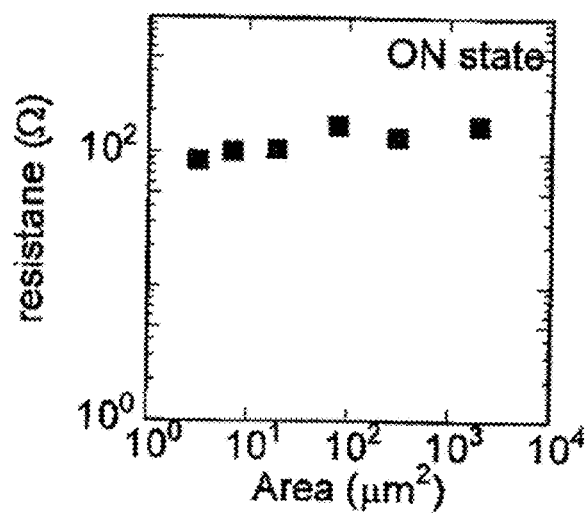
FIG. 4 is a view showing electrode area dependencies of on resistance in MIM type resistance change element of parallel plate type.
Figure 5:
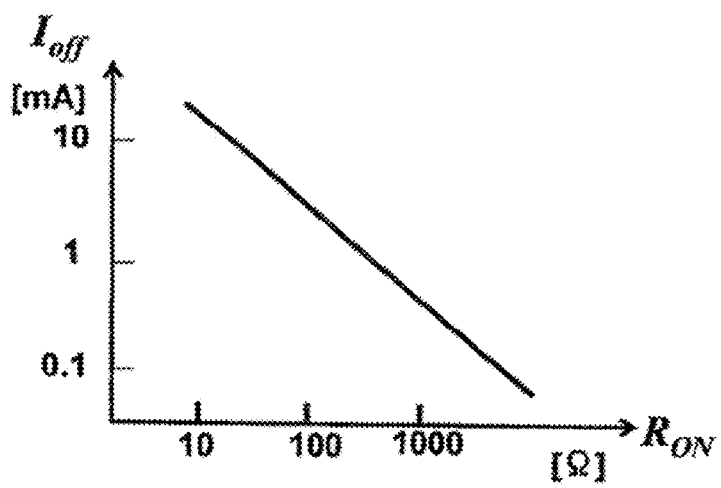
FIG. 5 is a view showing a qualitative relationship between resistance value (RON) in the low resistance state and current value (IOFF) required to switch the state to the high resistance state in a two-terminal type resistance change element.
Figure 6:
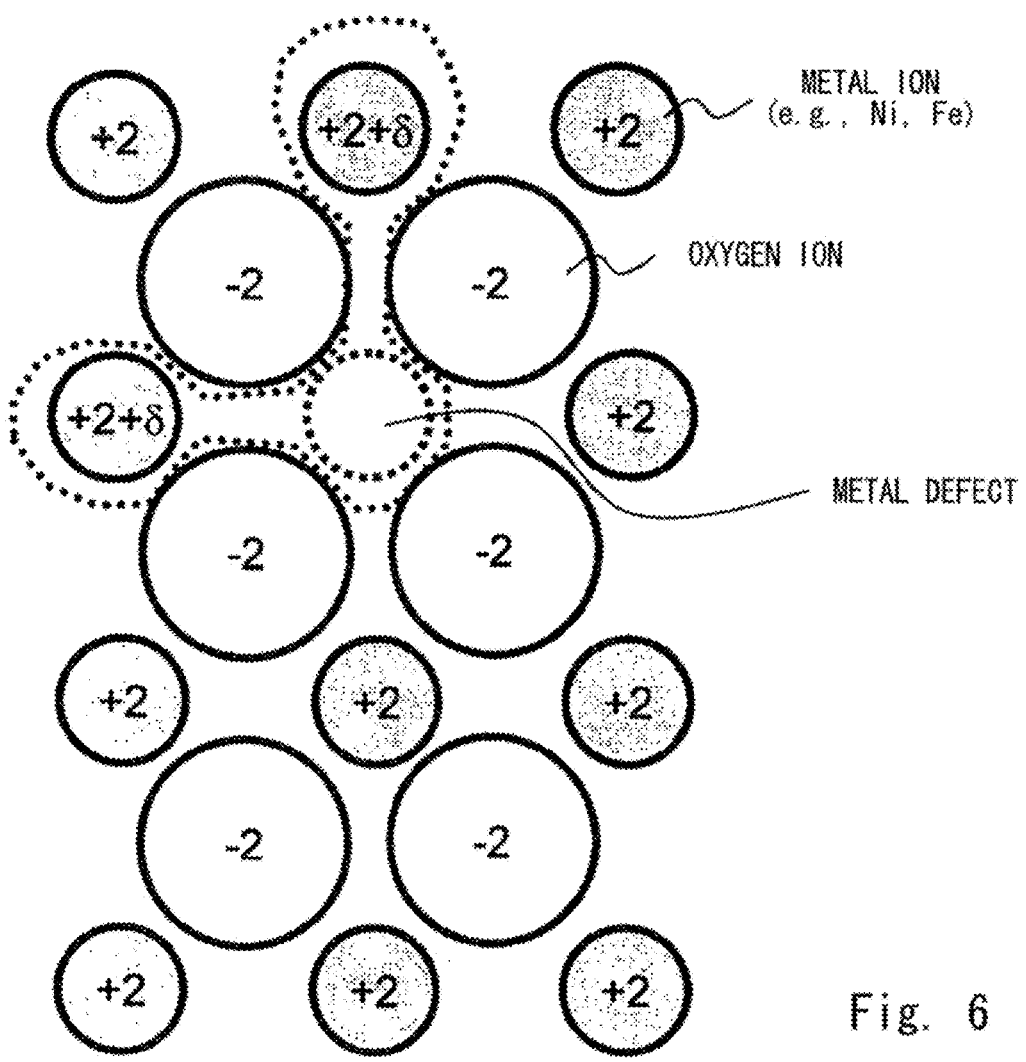
Figure 7:
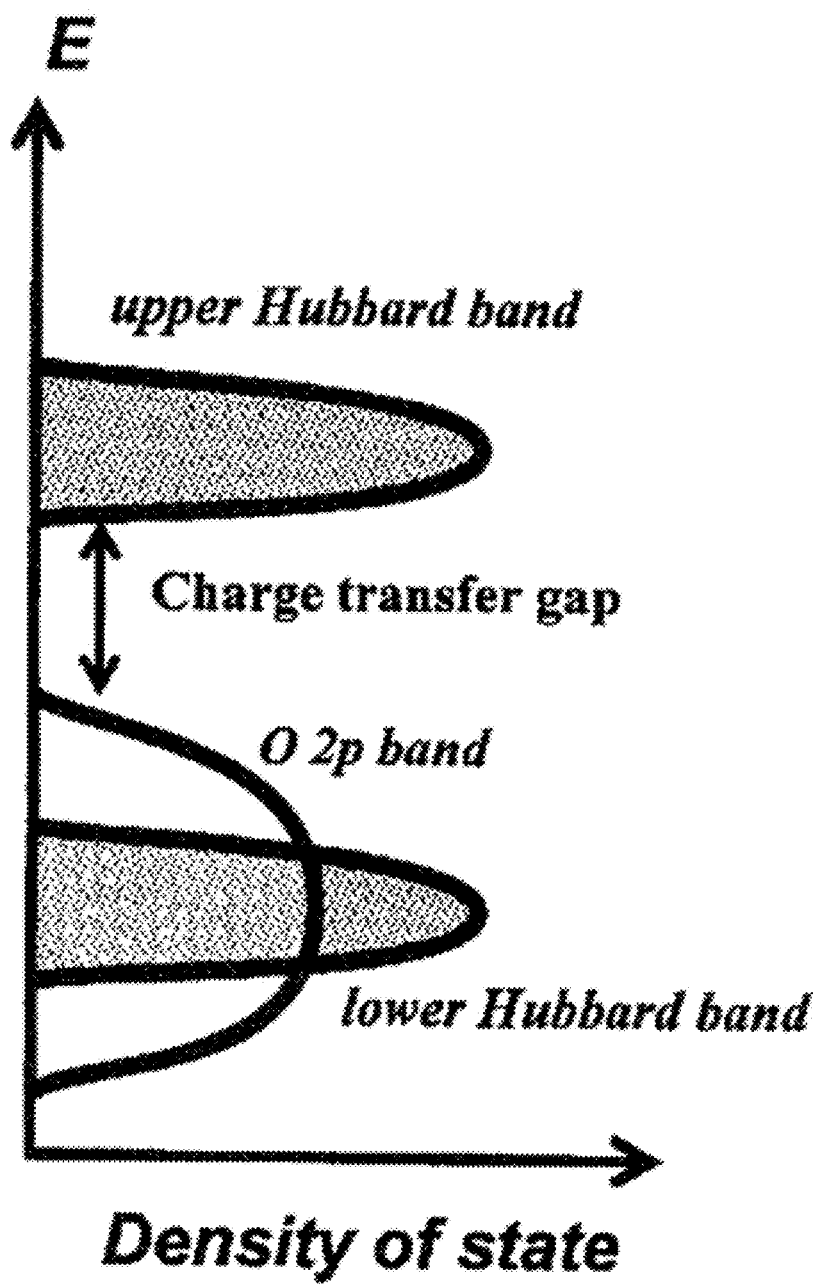
Figure 8:
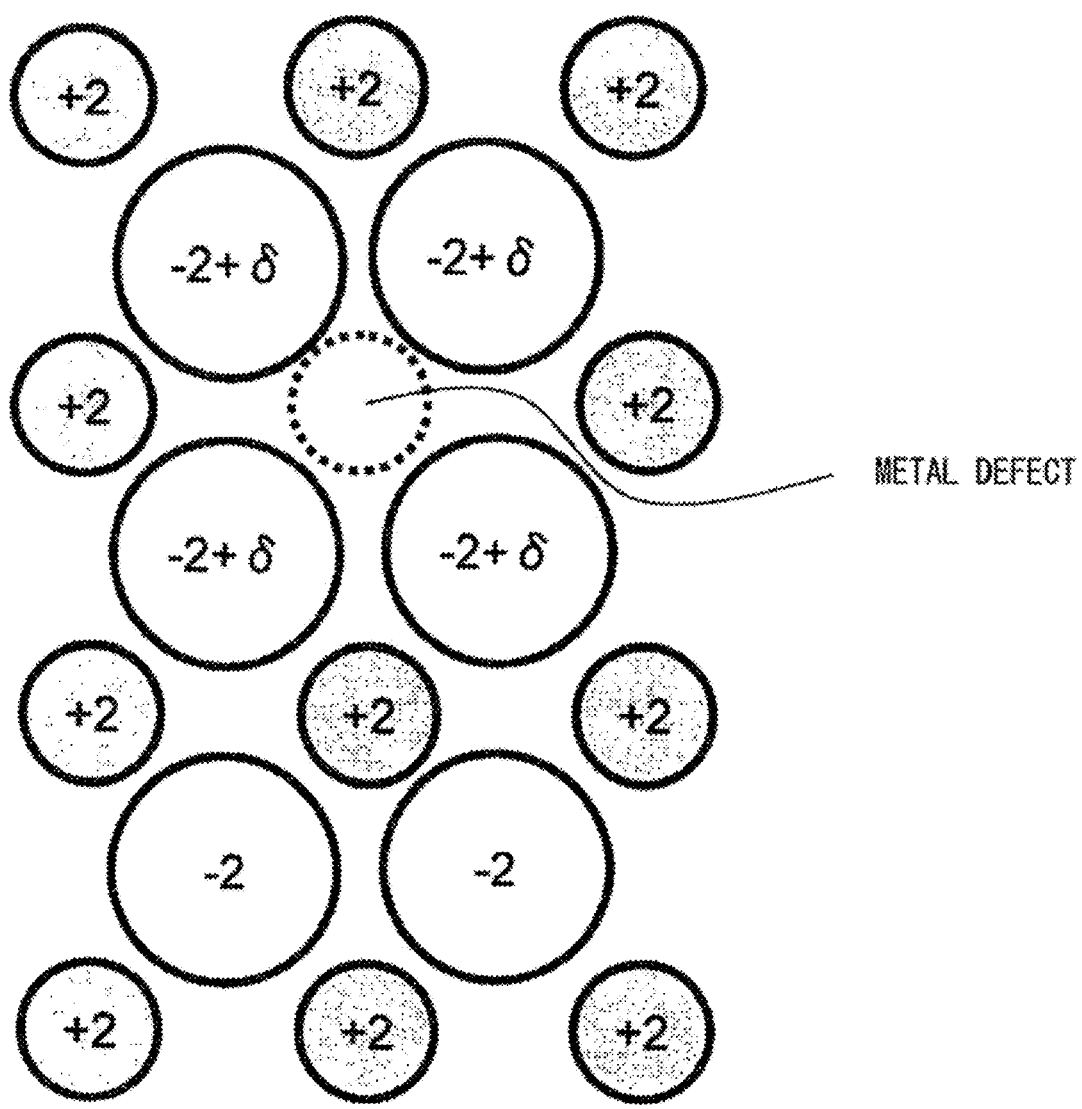
Figure 9:
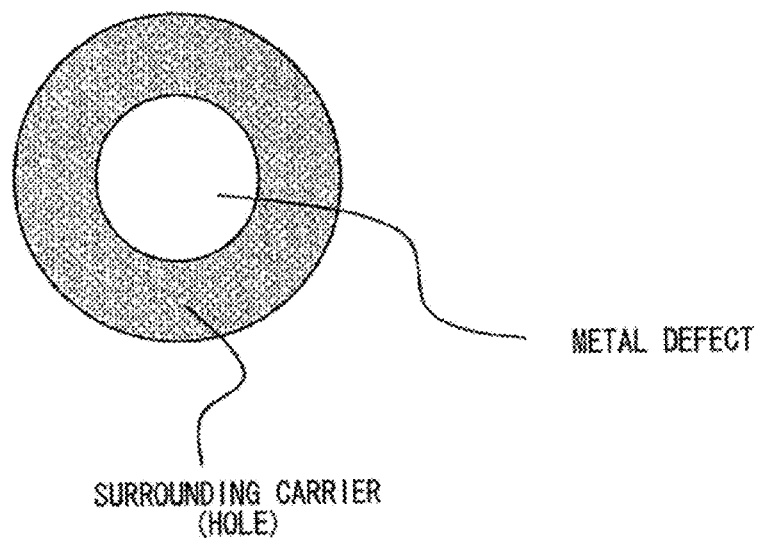
FIG. 9 is a schematic view showing metal defect and hole which is localized around the metal defect.
Figure 10:
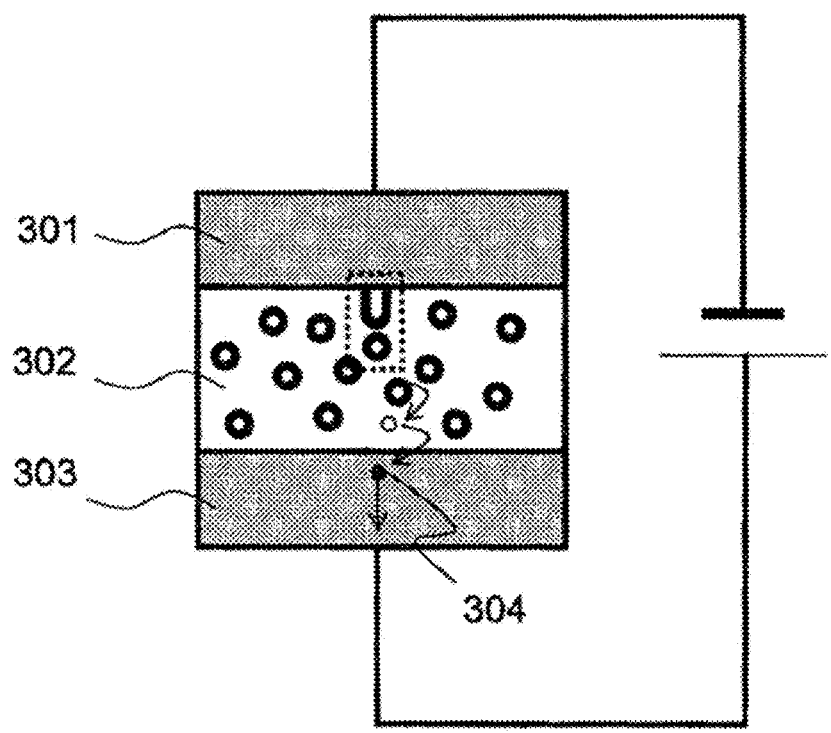
FIG. 10 is a schematic sectional view of a two-terminal MIM type resistance change element.
Figure 11:
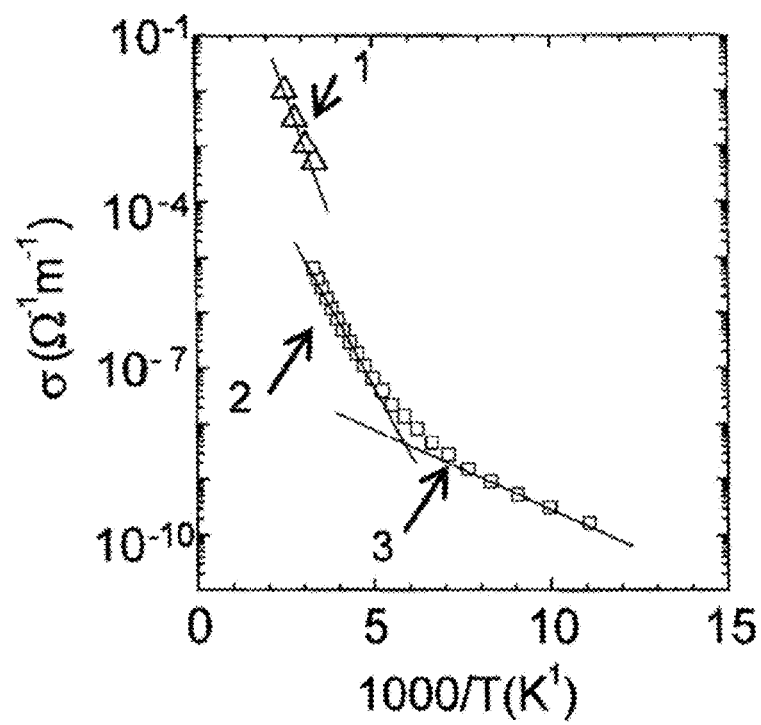
FIG. 11 is a view showing temperature dependencies of electric conductivity of NiO element in the high resistance state.
Figure 12:
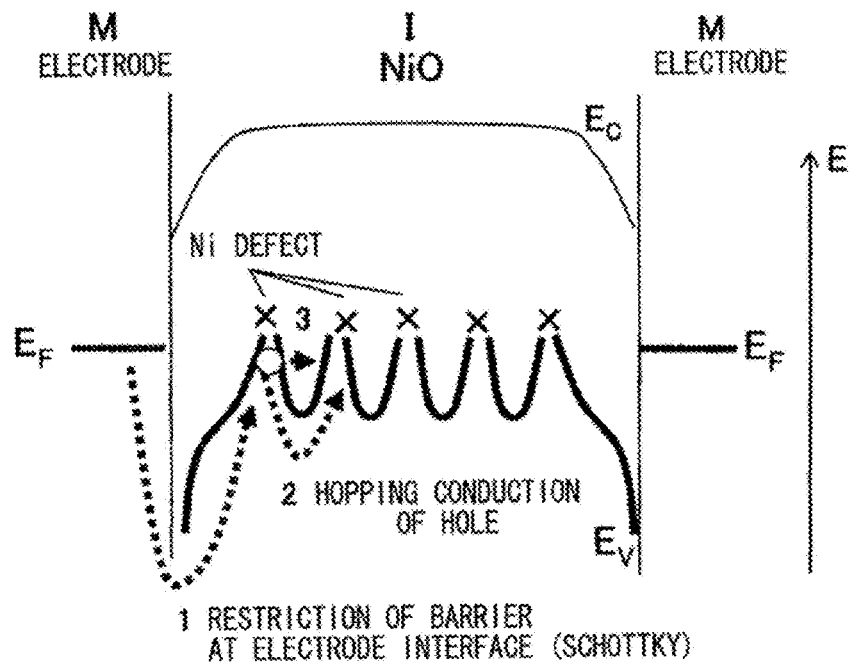
FIG. 12 is a schematic band structure showing an electric conduction mechanism in the high resistance state.
Figure 13:
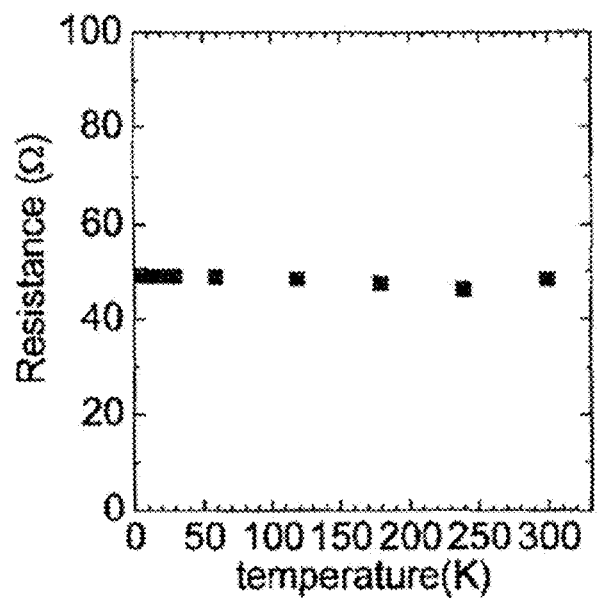
FIG. 13 is a view showing temperature dependencies of electric resistance of NiO element in the low resistance state.
Figure 14:
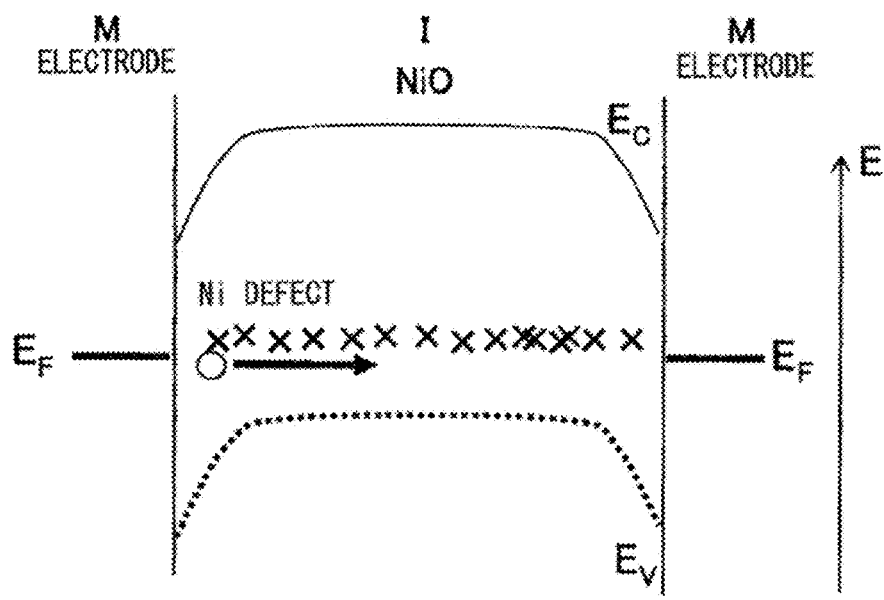
FIG. 14 is a schematic band structure showing an electric conduction mechanism in the low resistance state.
Figure 15:
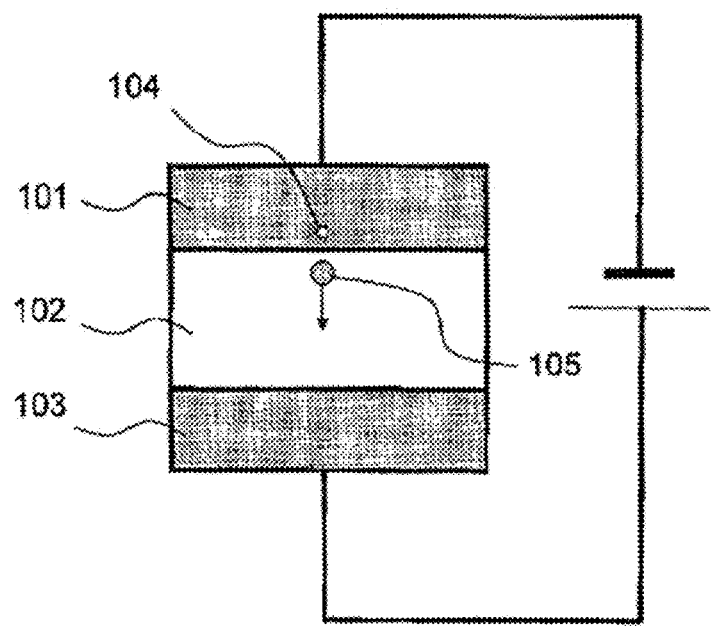
FIG. 15 is a schematic sectional view of a first element showing the operating principle of a PCM cell.
Figure 16:
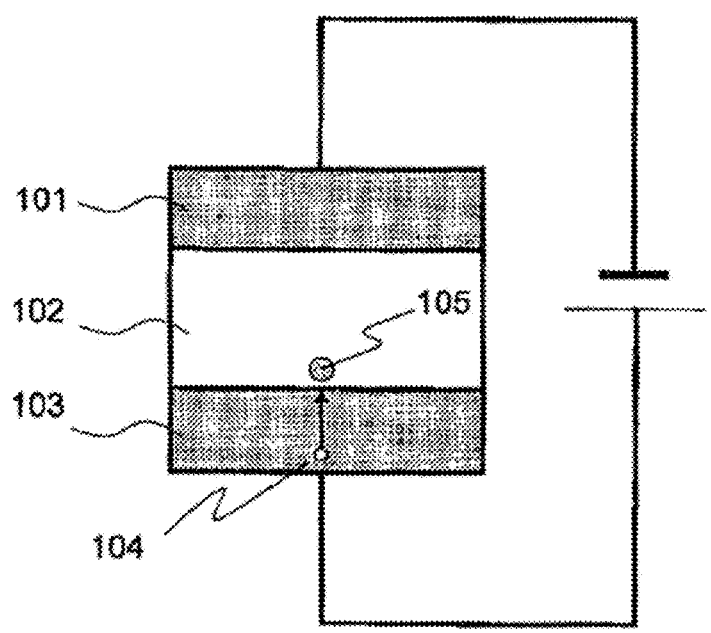
FIG. 16 is a schematic sectional view of a second element showing the operating principle of the PCM cell.
Figure 17:
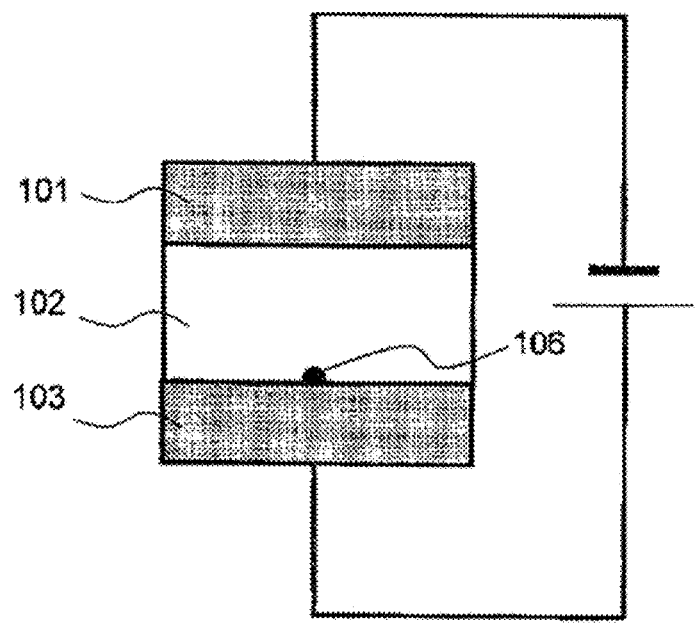
FIG. 17 is a schematic sectional view of a third element showing the operating principle of the PCM cell.
Figure 18:
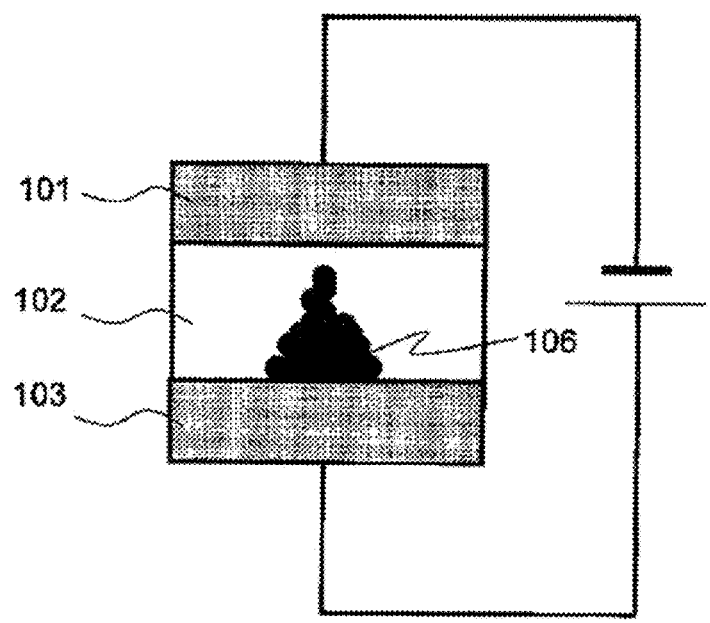
FIG. 18 is a schematic sectional view of a fourth element showing the operating principle of the PCM cell.
Figure 19:
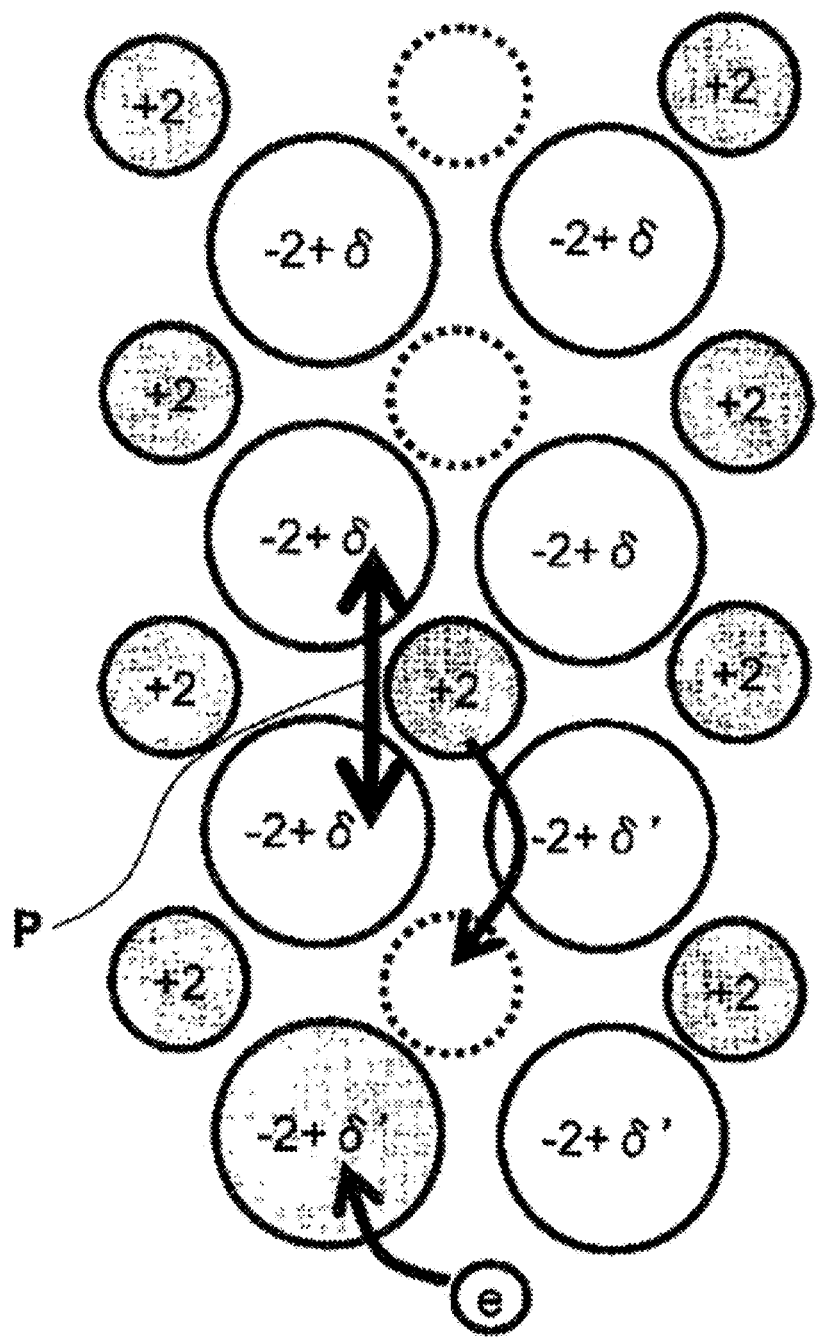
FIG. 19 is a schematic view showing the product nucleus of the current pathway 4 in the NiO element and the surrounding area of Ni defects located adjacent each other (enlarged view within the range of dotted line in FIG. 10)
Figure 20:
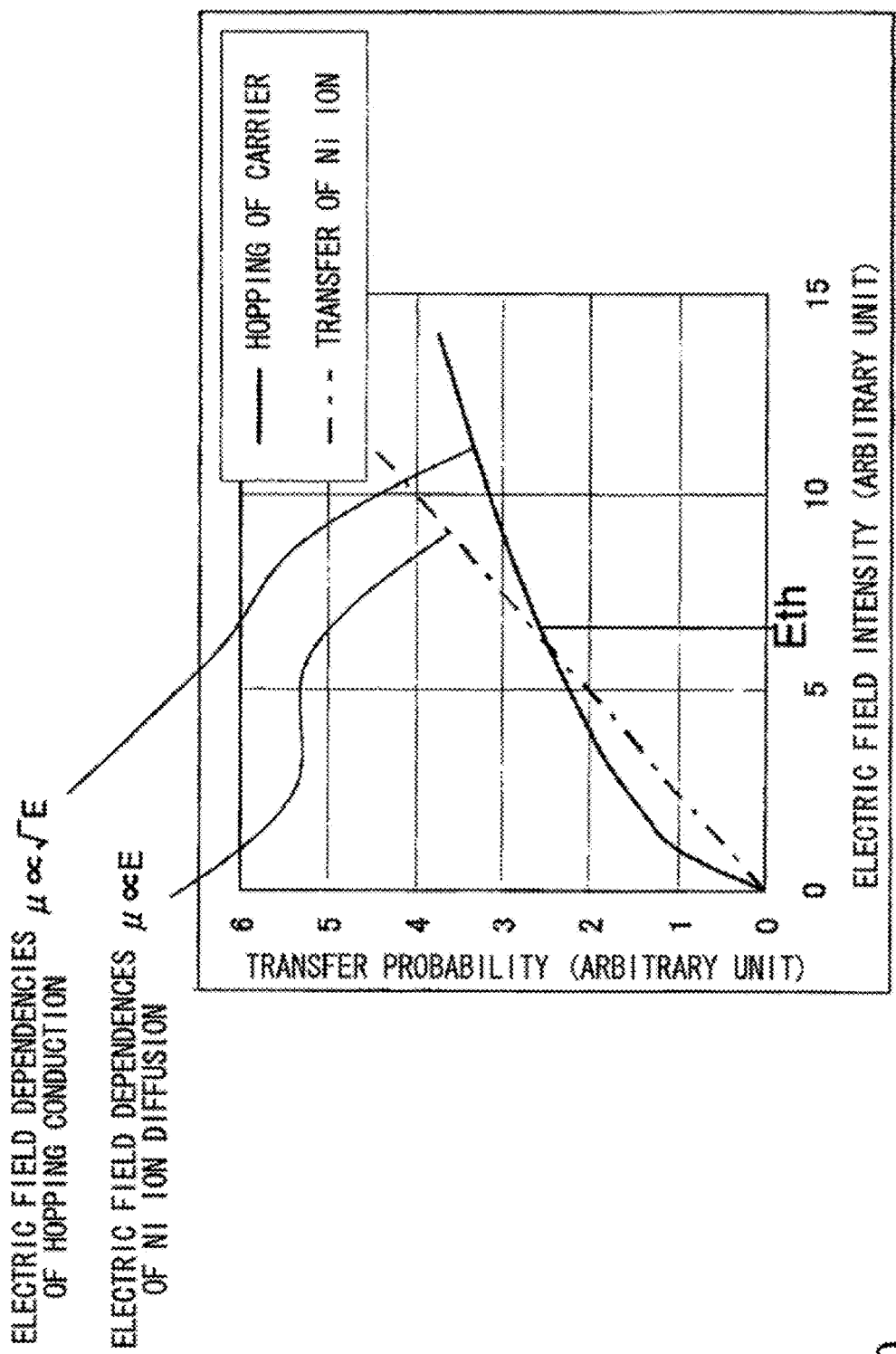
FIG. 20 is a view showing the electric field dependencies of the hopping conduction of the hole and the transfer of the metal ion.
Figure 21:
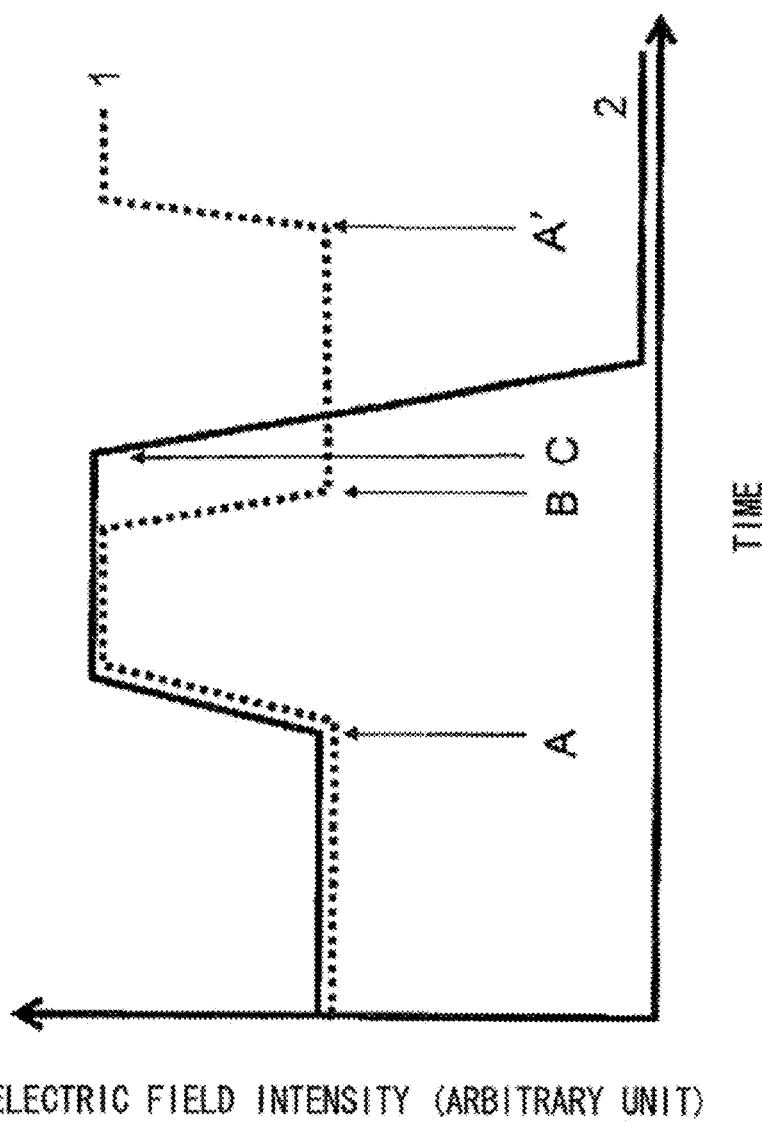
FIG. 21 is a view showing the time change of the electric field intensity of the point indicated by "P" in FIG. 19.
Figure 22:
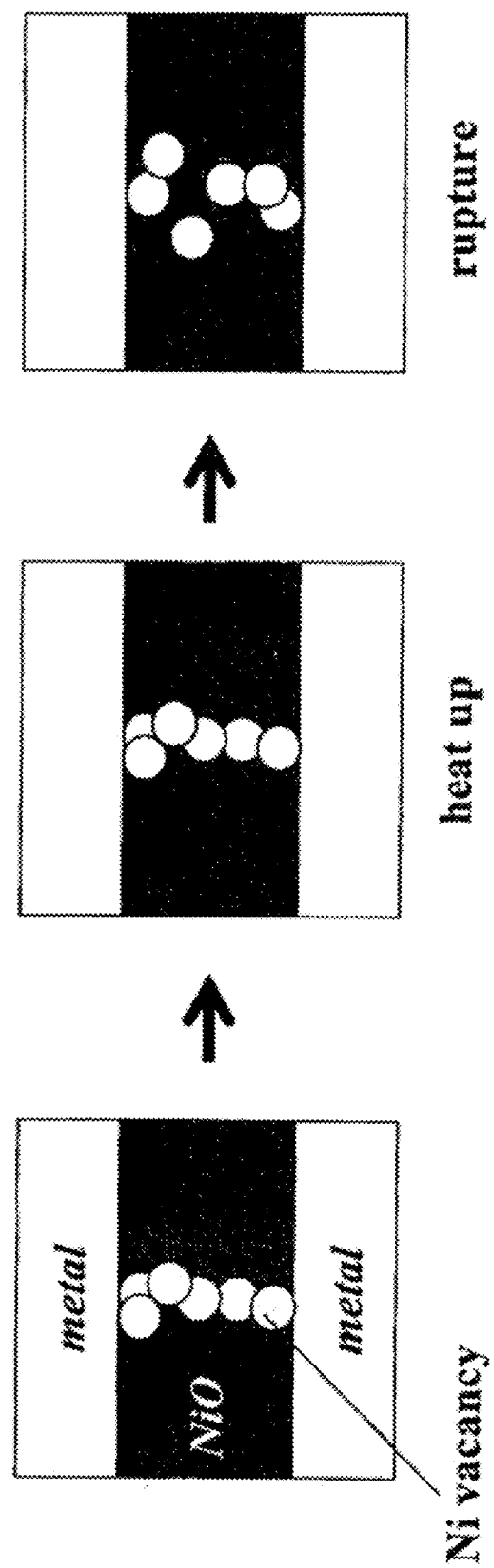
FIG. 22 is a view showing the destruction process of the current pathway 4 in the low resistance state.
Figure 23:
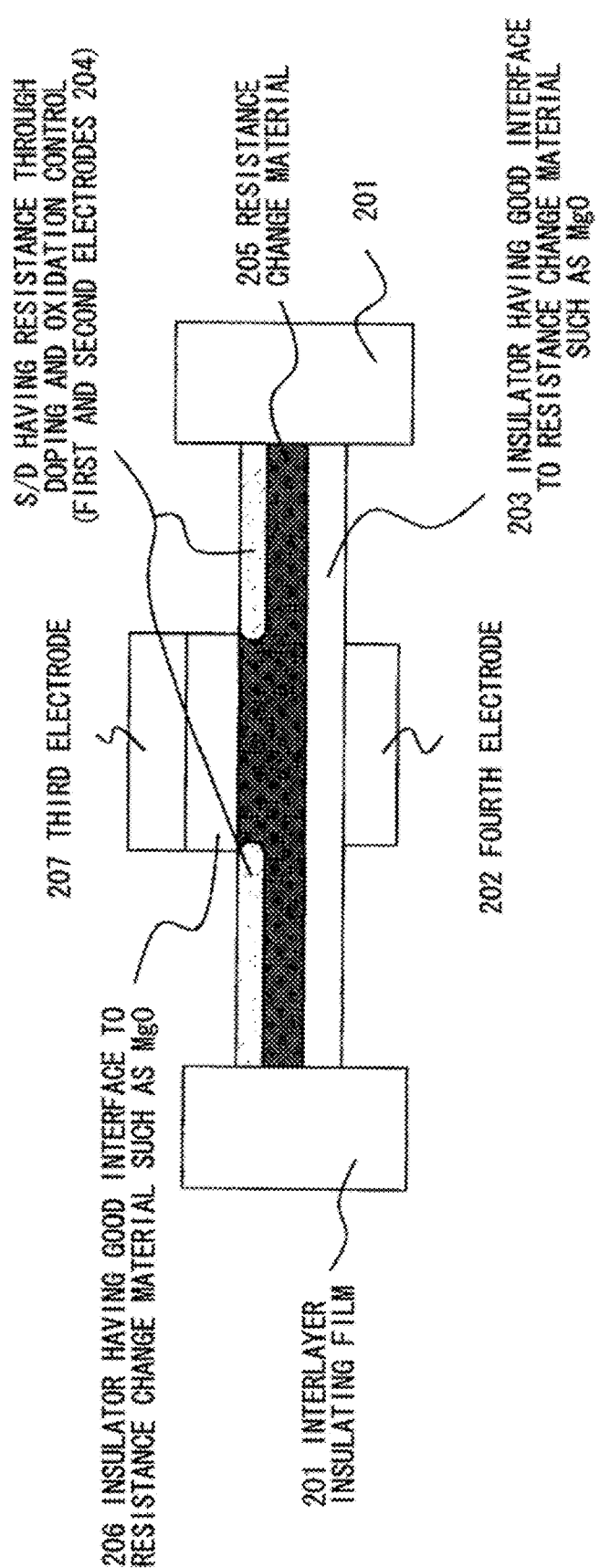
FIG. 23 is a structural view of the elementary elements to reduce the current required to switch the state to the high resistance state.
Figure 24:
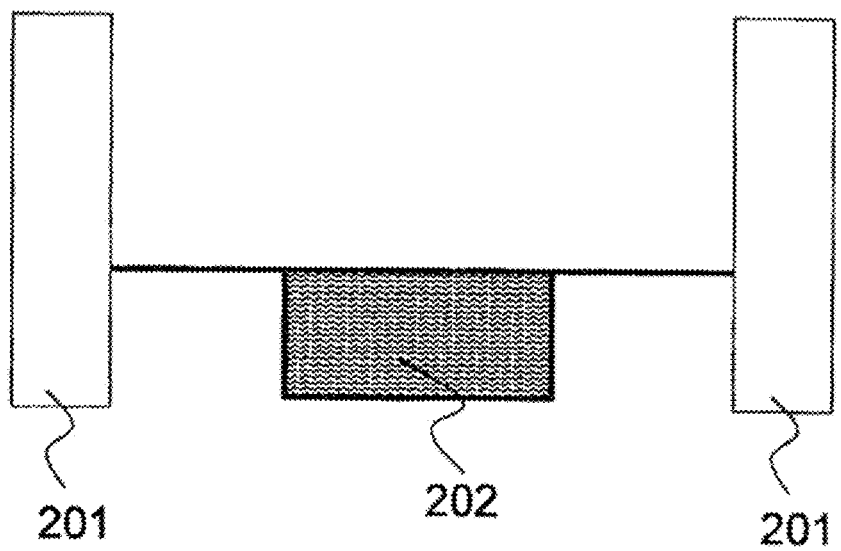
FIG. 24 is a first view showing the manufacturing process of the first exemplary embodiment.
Figure 25:
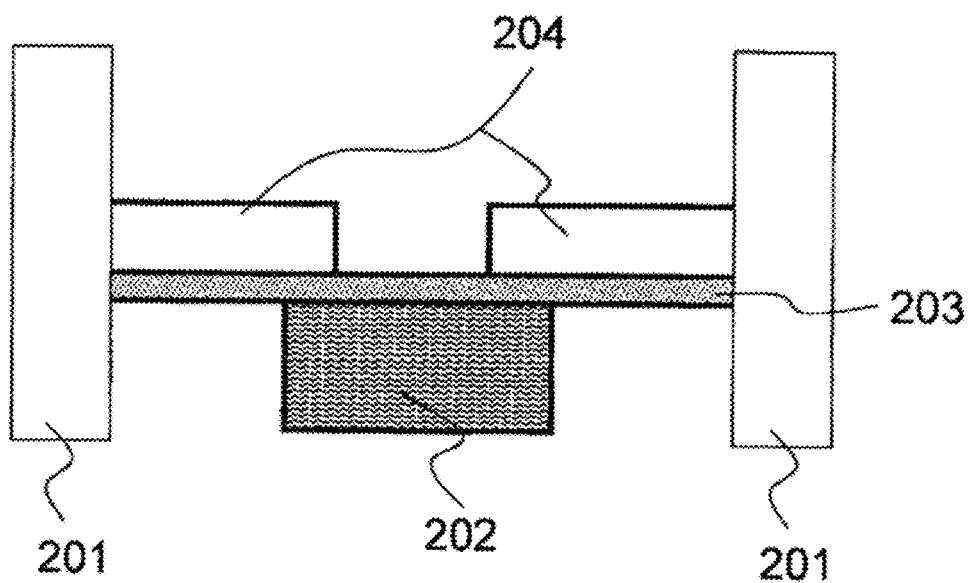
FIG. 25 is a second view showing the manufacturing process of the first exemplary embodiment.
Figure 26:
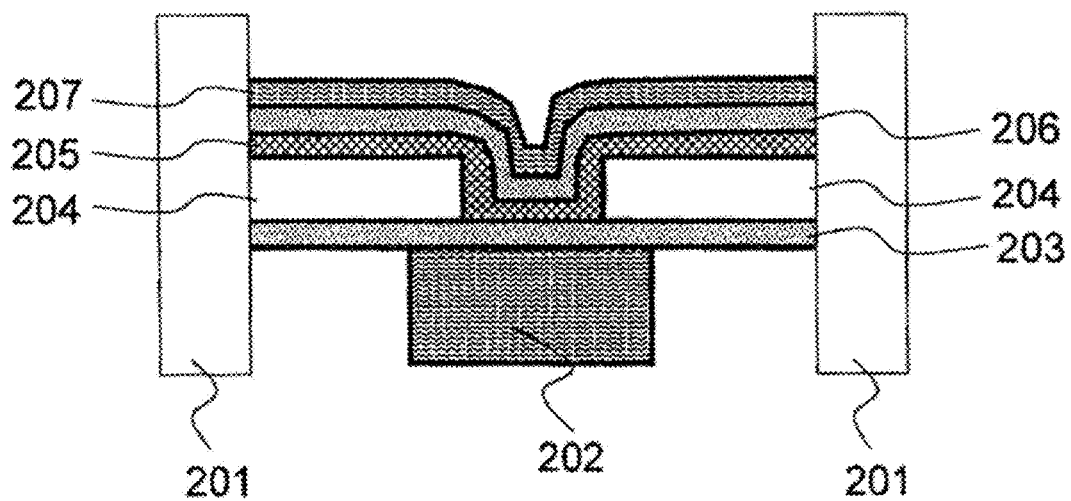
FIG. 26 is a third view showing the manufacturing process of the first exemplary embodiment.
Figure 27:
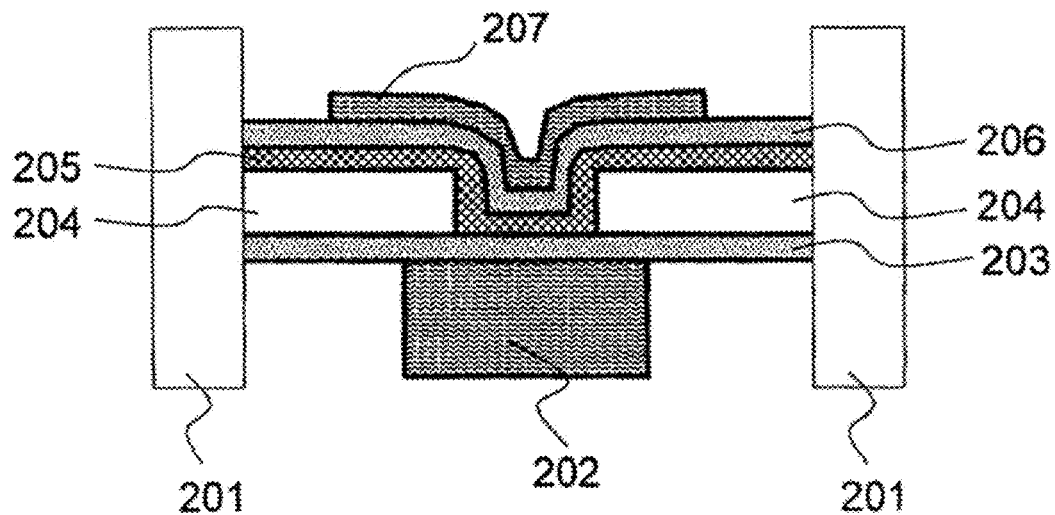
FIG. 27 is a fourth view showing the manufacturing process of the first exemplary embodiment.
Figure 28:
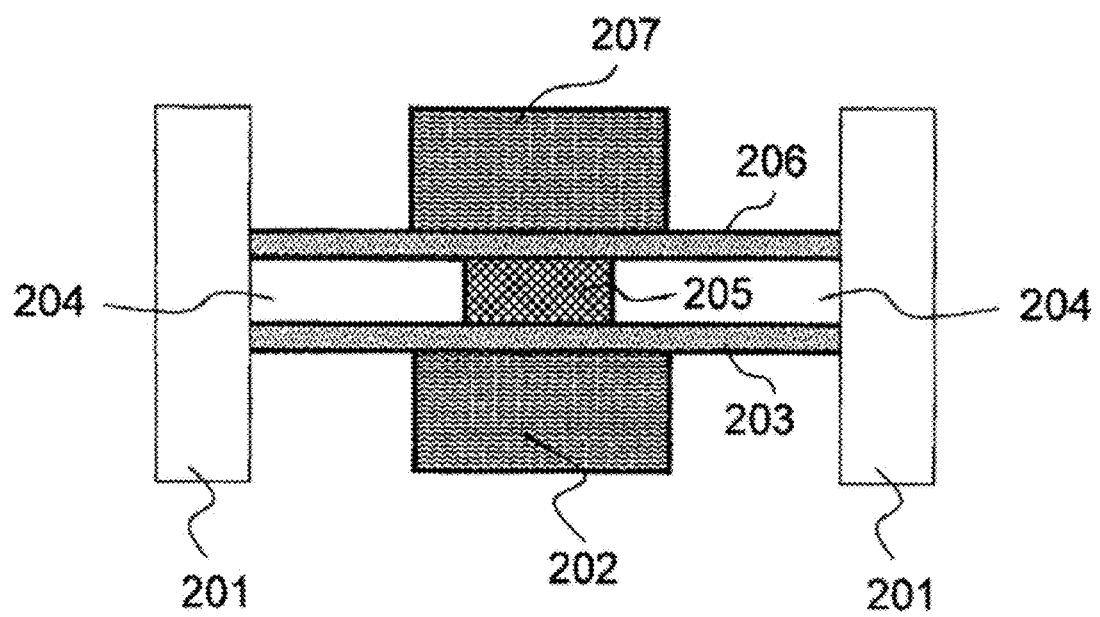
FIG. 28 is a view showing the manufacturing process of the second exemplary embodiment.
Figure 29:
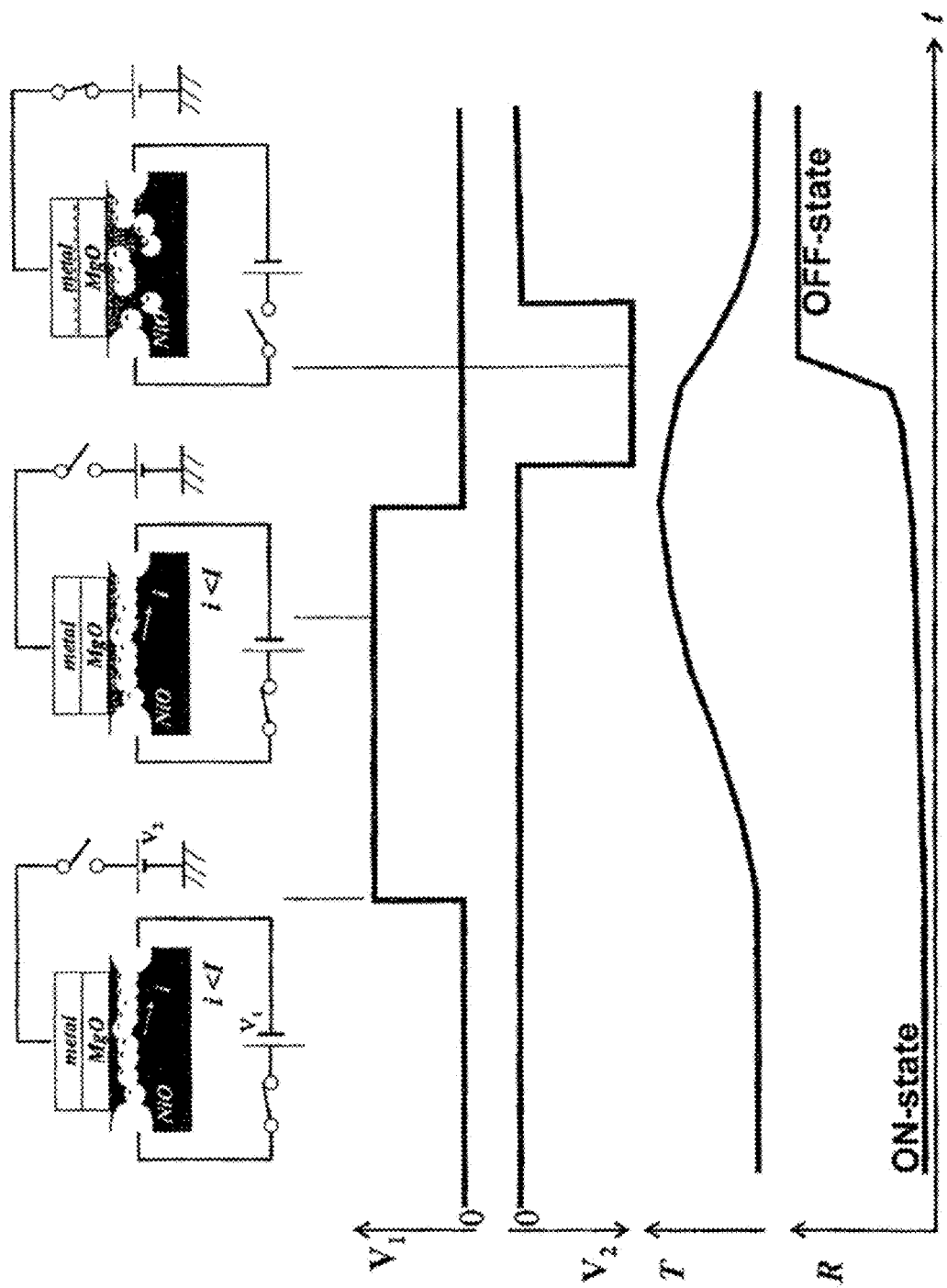
FIG. 29 is a view showing the most suitable driving method in the first and the second exemplary embodiments.

1 FIRST ELECTRODE
2 RESISTANCE CHANGE MATERIAL MADE OF METAL OXIDE
3 SECOND ELECTRODE
4 CURRENT PATHWAY
101 ELECTRODE
102 SOLID ELECTROLYTE
103 COUNTER ELECTRODE
104 ELECTRON
105 IONIZED ELECTRODE CONSTITUENT ELEMENT (ION)
106 ELECTRODE CONSTITUENT ELEMENT REDUCED AT INTERFACE OF COUNTER ELECTRODE (METAL ELEMENT)
201 INTRELAYER INSULATING FILM
202 FOURTH ELECTRODE
203 INSULATOR
204 FIRST AND SECOND ELECTRODES
205 RESISTANCE CHANGE MATERIAL
206 INSULATOR
207 THIRD ELECTRODE
301 ELECTRODE
302 TRANSITION METAL OXIDE
303 COUNTER ELECTRODE
304 ELECTRON

The invention claimed is:

1. A resistance change element comprising:
a resistance change material of a charge-transfer type insulator;
a first and a second electrodes formed on the resistance change material; and
a third electrode formed on the resistance change material via an insulating material which does not show resistance change;

wherein none of the first, second and third electrodes supply ions to the resistance change material, the first and the second electrode form a filament of a lattice defect in the resistance change material by an application of an electric field therebetween and make the resistance change material a low resistance state, and the third electrode applies an electric field at an angle not parallel to the filament thereto and switches a state thereof to a high resistance state from the low resistance state.

2. A semiconductor memory device comprising:
the resistance change element according to claim 1.

3. The resistance change element according to claim 1, wherein the resistance change material is one selected from NiO, CoO and MnO.

4. The resistance change element according to claim 1, wherein the insulating material is one selected from MgO and Al2O3.

5. A manufacturing method of a resistance change element having a resistance change material of a charge-transfer type insulator and three electrodes thereon without supplying ion to the resistance change material, the method comprising:
    forming a first insulator in an interlayer insulation film;
    forming a first and a second electrodes on the first insulator;
    forming an insulating material which does not show resistance change on the first insulator so as to cover the first and the second electrodes; and
    forming a third electrode on the insulating material,
    wherein the first and the second electrode function to form a filament of a lattice defect in the resistance change material by an application of an electric field therebetween and to make the resistance change material a low resistance state, and the third electrode functions to switch a state thereof to a high resistance state from the low resistance state by applying in an electric field thereto at an angle not parallel to the filament.

6. A driving method of a resistance change element having a resistance change material of a charge-transfer type insulator and three electrodes, the three electrodes comprising:
    a first and a second electrodes formed on the resistance change material; and
    a third electrode formed on the resistance change material via an insulating material which does not show resistance change, none of the electrodes supplying ion to the resistance change material, the method comprising:
    forming a filament of a lattice defect in the resistance change material by applying an electric field between the first electrode and the second electrode and making the resistance change material a low resistance state therebetween; and
    applying an electric field at an angle not parallel to the filament thereto
    and cutting the filament thereby to switch a state thereof to a high resistance state from the low resistance state.

* * * * *